United States Patent
Batish et al.

(10) Patent No.: US 6,955,949 B2
(45) Date of Patent: Oct. 18, 2005

(54) SYSTEM AND METHOD FOR REDUCING OR ELIMINATING SEMICONDUCTOR DEVICE WIRE SWEEP

(75) Inventors: Rakesh Batish, Royersford, PA (US); Andrew F. Hmiel, Glenside, PA (US); Glenn Sandgren, Ambler, PA (US); Walt VonSeggern, New Hope, PA (US); C. Scott Kulicke, Fort Washington, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 10/686,974

(22) Filed: Oct. 16, 2003

(65) Prior Publication Data

US 2005/0085019 A1 Apr. 21, 2005

(51) Int. Cl.[7] .............................................. H01L 21/44
(52) U.S. Cl. ....................................................... 438/125
(58) Field of Search ................................ 438/106, 125; H01L 21/56

(56) References Cited

U.S. PATENT DOCUMENTS

| | | |
|---|---|---|
| 4,523,371 A | 6/1985 | Wakashima |
| 4,788,583 A | 11/1988 | Kawahara et al. |
| 4,974,057 A | 11/1990 | Tazima |
| 5,097,317 A | 3/1992 | Fujimoto et al. |
| 5,206,794 A | 4/1993 | Long |
| 5,310,702 A | 5/1994 | Yoshida et al. |
| 5,331,205 A | 7/1994 | Primeaux |
| 5,434,105 A | 7/1995 | Liou |
| 5,736,792 A | 4/1998 | Orcutt |
| 5,818,105 A | 10/1998 | Kouda |
| 5,824,568 A | 10/1998 | Zechman |
| 6,177,726 B1 | 1/2001 | Manteghi |
| 6,215,182 B1 | 4/2001 | Ozawa et al. |
| 6,297,078 B1 | 10/2001 | Barrow |
| 6,340,846 B1 | 1/2002 | LoBianco et al. |
| 6,344,401 B1 | 2/2002 | Lam |
| 6,368,899 B1 | 4/2002 | Featherby et al. |
| 6,395,807 B1 | 5/2002 | Kinose et al. |
| 2003/0027918 A1 | 2/2003 | Tsutsumi et al. |
| 2003/0090001 A1 | 5/2003 | Beatson et al. |

FOREIGN PATENT DOCUMENTS

| | | | |
|---|---|---|---|
| EP | 0601323 | 6/1994 | |
| GB | 2279944 | 1/1995 | |
| JP | 03229433 | 10/1991 | |
| JP | 09-129663 | * 5/1997 | ........... H01L/21/60 |
| JP | 11087424 | 3/1999 | |
| JP | 2001068802 | 3/2001 | |

OTHER PUBLICATIONS

PCT International Search Report for PCT/US2004/018000, dated Jan. 17, 2005.
International Search Report for PCT International Application No. PCT/US2004/017981, mailed Oct. 13, 2004.

* cited by examiner

*Primary Examiner*—W. David Coleman
(74) *Attorney, Agent, or Firm*—RatnerPrestia (57) ABSTRACT

A method of packaging a semiconductor device is provided. The method includes applying an insulative material across only a portion of at least two of a plurality of conductors providing interconnection between elements in the semiconductor device. The method also includes encapsulating the conductors and elements, thereby packaging the semiconductor device.

11 Claims, 9 Drawing Sheets

SYSTEM AND METHOD FOR REDUCING OR ELIMINATING SEMICONDUCTOR DEVICE WIRE SWEEP

FIELD OF THE INVENTION

This invention relates to packaging semiconductor devices, and more particularly to a method of reducing or eliminating wire sweep and sway in packaged semiconductor devices.

BACKGROUND OF THE INVENTION

Figure 1:
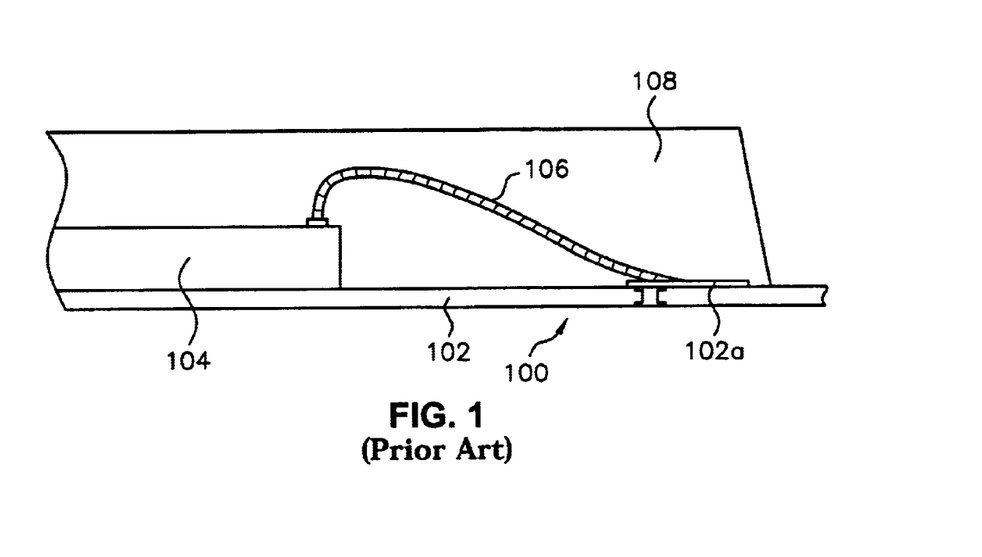
FIG. 1 is a cut away side view of an interconnection between semiconductor elements in a prior art semiconductor device.

In the fabrication of semiconductor devices, conductors (e.g., bonding wires) are often utilized to provide interconnection between elements of the semiconductor device. For example, FIG. 1 illustrates a portion of conventional semiconductor device 100. Semiconductor device 100 includes leadframe 102 and leadframe contact(s) 102a. Semiconductor element (e.g., die) 104 is mounted on leadframe 102. Bonding wire 106 provides interconnection between semiconductor element 104 and leadframe contact 102a. Overmold 108 (i.e., a mold compound) is provided over bonding wire 106, semiconductor element 104, and leadframe contact 102a. In the configuration illustrated in FIG. 1, a number of bonding wires 106 may be included in semiconductor device 100 to provide interconnection between various connection points on semiconductor element 104 and corresponding leadframe contacts 102a.

During the process of fabricating semiconductor device 100, short circuits between adjacent bonding wires 106, or open circuits in connection with one or more bonding wires 106 may occur. For example, during fabrication, movement (e.g., sway, sweep, etc.) of bonding wires 106 may result in a short circuit between adjacent bonding wires 106.

Figure 2:
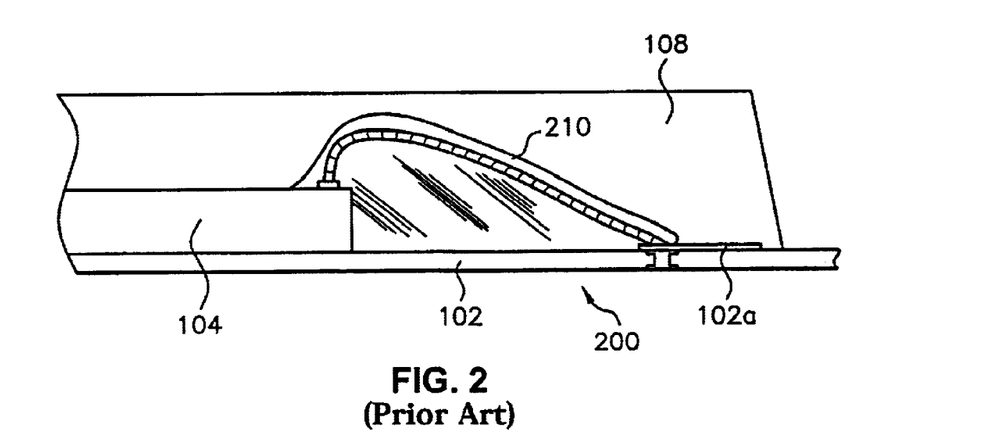
FIG. 2 is a cut away side view of an encapsulated interconnection between semiconductor elements in a prior art semiconductor device.

FIG. 2 illustrates a conventional semiconductor device 200 including an encapsulant 110 over bonding wire 106. Encapsulant 110 also covers the connection points between bonding wire 106 and each of semiconductor element 104 and leadframe contact 102a. In other respects, the elements illustrated in FIG. 2 are very similar to those illustrated and described above with respect to FIG. 1.

Figure 3:
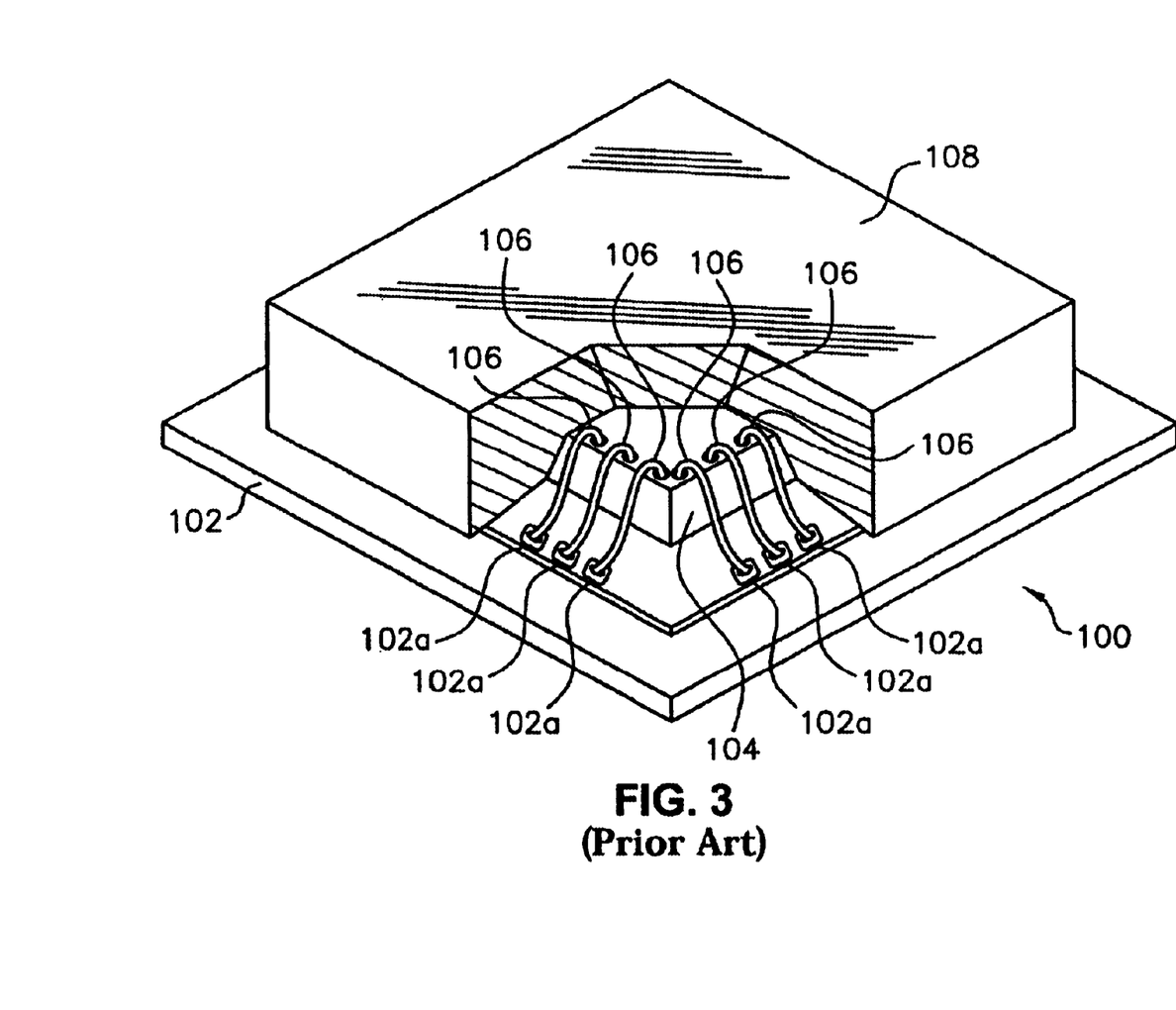
FIG. 3 is a perspective view of a plurality of interconnections between semiconductor elements in a prior art semiconductor device.

FIG. 3 is a perspective view of a conventional semiconductor device 100, similar to the device illustrated in FIG. 1. Semiconductor element 104 is illustrated mounted on leadframe 102. A plurality of bonding wires 106 provide interconnection between semiconductor element 104 and corresponding leadframe contacts 102a. Overmold 108 (partially cut away in FIG. 3) is provided over semiconductor element 104 and bonding wires 106.

Figure 4:
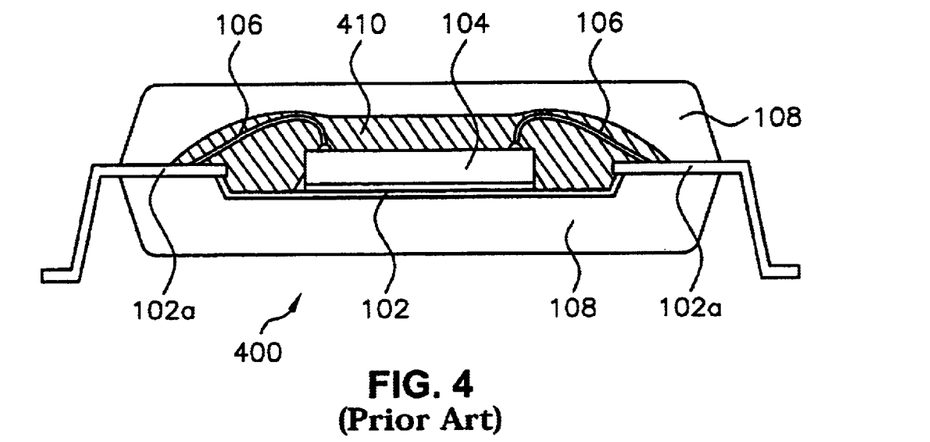
FIG. 4 is a cut away side view of an encapsulated interconnection between semiconductor elements in a prior art semiconductor device.

FIG. 4 is a cut away side view of a conventional semiconductor device 400. As in FIGS. 1–3, semiconductor element 104 is mounted on leadframe 102, and bonding wires 106 provide interconnection between semiconductor element 104 and leadframe contacts 102a. Encapsulant 410 is provided over semiconductor element 104, and bonding wires 106. Overmold 108 is provided above and below semiconductor element 104 in the illustration of FIG. 4.

Various problems have been found in the conventional semiconductor device configurations illustrated in FIGS. 1–4. As provided above, during fabrication and movement of the semiconductor devices, bonding wires 106 may be become loose (i.e., open circuit) at one of the connection points (i.e., at semiconductor element 104 or leadframe contact 102a). Further, adjacent bonding wires 106 may move (e.g., sway) towards each other, thereby creating short circuits in the semiconductor device. These issues are particularly problematic in view of the desire to decrease the size of semiconductor devices (and the corresponding desire to increase conductor density in semiconductor devices). These fabrication shortcomings result in defective components within semiconductor lots, resulting in higher manufacturing costs and poor reliability. As such, it would be desirable to provide improved methods of fabricating semiconductor devices.

SUMMARY OF THE INVENTION

To overcome the deficiencies of the prior art, in an exemplary embodiment of the present invention, a method of packaging a semiconductor device is provided. The method includes applying an insulative material across only a portion of at least two of a plurality of conductors providing interconnection between elements in the semiconductor device. The method also includes encapsulating the conductors and elements, thereby packaging the semiconductor device.

According to another exemplary embodiment of the present invention, a semiconductor device is provided. The semiconductor device includes a plurality of semiconductor elements, and a plurality of conductors providing interconnection between the plurality of semiconductor elements. The semiconductor device also includes an insulative material applied across only a portion of at least two of the plurality of conductors. Further, the semiconductor device includes an encapsulation layer encapsulating the conductors and semiconductor elements for packaging the semiconductor device.

BRIEF DESCRIPTION OF THE DRAWINGS

Exemplary embodiments of the invention will be described with reference to the drawings, of which.

DETAILED DESCRIPTION OF THE INVENTION

Preferred features of selected embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

As used herein, the term semiconductor device relates to a broad category of devices including packaged semiconductor devices such as integrated circuits, memory devices, DSPs (i.e., digital signal processors), QFP (i.e., quad-flat package), PBGA (i.e., plastic ball grid array), BOC (board on chip), COB (i.e., chip on board), CABGA (chip array ball grid array), and discrete devices (i.e., non-packaged devices, may be more than one device on one board). Further, the term semiconductor element refers to any portion of a semiconductor device, including substrates, dies, chips, leadframes, leadframe contacts, etc.

Generally speaking, the present invention relates to placing a insulative material (e.g., in the form of a polymer bead, strip, or preformed shape) across bonding conductors (i.e., bonding wires) that provide interconnection between various semiconductor elements in a semiconductor device.

The insulative material (e.g., a polymer bridge) creates a lattice (i.e., a lattice bridge) or structure which will provide additional stability to the conductors such that the conductors are separated (i.e., not short-circuited) during further processing (e.g., during transfer molding). Further, if the insulative material is applied as at least partially fluid, it may distribute, through fluid forces, throughout the interconnected conductor network during molding of the semiconductor device. This separation and force transfer reduces wire sweep and sway, and reduces or eliminates short circuiting resulting from an overmolding process.

After application of the insulative material (e.g., a polymer material such as an epoxy resin), the resin is cured using at least one of heat or ultraviolet energy. An overmold may then be applied to provide a is packaged semiconductor device without the wires moving or "sweeping" toward one another.

According to certain embodiments of the present invention, the methods and devices disclosed herein are particularly suited to the assembly of bonding wired semiconductor devices fabricated by contract and integrated device manufacturers. Certain embodiments of the present invention are particularly useful in relation to semiconductor devices having long conductors/bonding wires, or having complex bonding wired geometries (e.g., QFPs, stacked die devices, and BGAs).

In contrast to prior art fabrication methods, various embodiments of the present invention utilize very little insulative material (e.g., a polymer material) in ring, rectangular, and/or any suitable configurations around or about a semiconductor element included in the semiconductor device.

As will be explained herein, certain embodiments of the present invention provide additional advantages over prior art fabrication techniques, including: additional flexibility in the fabrication process, minimization of expensive polymer used for stabilizing the conductors, and universal semiconductor device application. Exemplary embodiments of the present invention reduce sweep on complex semiconductor device types (e.g., stacked die devices), and allow for extended conductor lengths in, for example, QFPs and BGAs.

Figure 5:
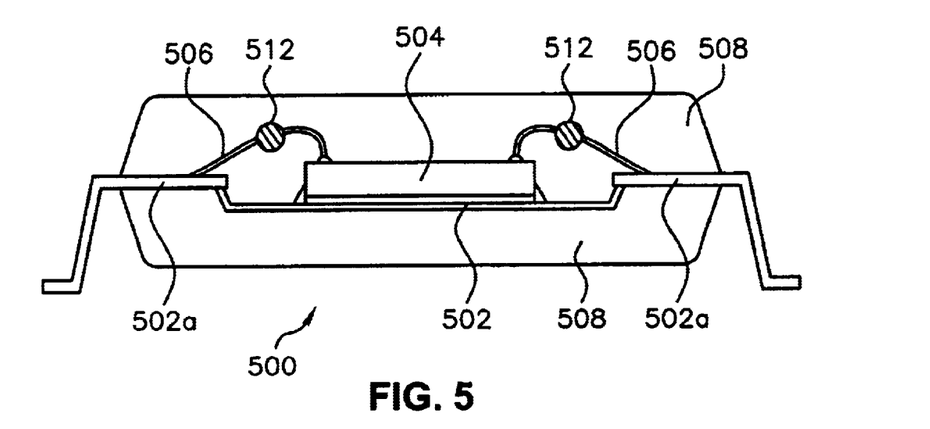
FIG. 5 is a cut away side view of an interconnection between semiconductor elements in a semiconductor device in accordance with an exemplary embodiment of the present invention.

FIG. 5 illustrates a cut away side view of semiconductor device 500 in accordance with an exemplary embodiment of the present invention. Semiconductor device 500 includes semiconductor element 504 (e.g., a die) mounted on leadframe 502. For example, semiconductor element 504 may be mounted to leadframe 502 using an adhesive. Bonding wires 506 provide interconnection between semiconductor element 504 and leadframe contacts 502a. Before overmold 508 is applied to the device, insulative material 512 is applied to a portion of bonding wires 506. For example, insulative material 512 may be applied in a rectangular, ring, and/or any suitable shape around or about semiconductor element 504. Further, insulative material 512 may be positioned closer to semiconductor element 504 (as opposed to leadframe contacts 502a), because bonding wires 506 have a closer pitch (i.e., are closer to adjacent bonding wires 506) at semiconductor element 504 than at leadframe contacts 502a. Alternatively, insulative material 512 may be positioned midway between semiconductor element 504 and leadframe contacts 502a. Further still, insulative material 512 may be positioned at any of a number of locations between semiconductor element 504 and leadframe contacts 502a, as desired in a given device.

By providing insulative material 512 across bonding wires 506, the position of each of the bonding wires 506 with respect to one another is stabilized. By stabilizing bonding wires 506 with respect to one another using insulative material 512, the risk of short circuiting adjacent bonding wires 506 during application of overmold 508 is substantially reduced if not eliminated. Additionally, by stabilizing the position of bonding wires 506, open circuiting of bonding wires 506 during fabrication may also be substantially reduced.

Insulative material 512 may be, for example, a polymer material such as an epoxy resin. Additionally, insulative material 512 may include insulative particles or beads that distribute between bonding wires 506 during application of insulative material 512 to bonding wires 506. Such insulative beads further stabilize bonding wires 506 with respect to one another. According to an exemplary embodiment of the present invention, the insulative beads distributed in the insulative material have a mean particle size of approximately 4.1 μm, a median particle size of 4.5 μm, and a maximum particle size of 20 μm. These insulative beads may be, for example, spherical silica particles.

Figure 6:
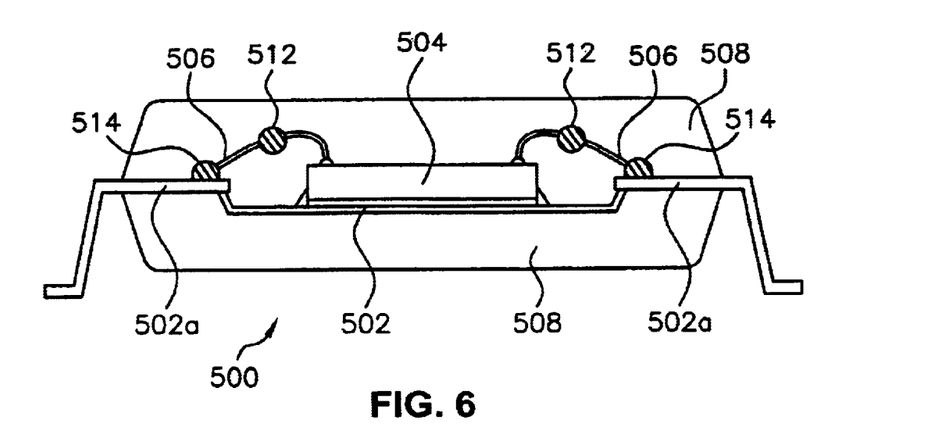
FIG. 6 is a cut away side view of an interconnection between semiconductor elements in a semiconductor device in accordance with another exemplary embodiment of the present invention.

FIG. 6 is a cut away side view of semiconductor device 600, where semiconductor device 600 is similar to the semiconductor device 500 illustrated in FIG. 5. As with the exemplary embodiment of the present invention illustrated in FIG. 5, FIG. 6 illustrates insulative material 512 provided across a portion of bonding wires 506. However, in additional to insulative material 512, FIG. 6 also illustrates insulative material 514 provided across another portion of bonding wires 506. Insulative material 514 may be provided in a similar configuration to insulative material 512 (e.g., in a rectangular, ring, and/or any suitable shape around or about semiconductor element 504). Additionally, insulative material 514 may be a polymer material such as an epoxy resin, and may include insulative beads as described above with respect to FIG. 5.

Figure 7:
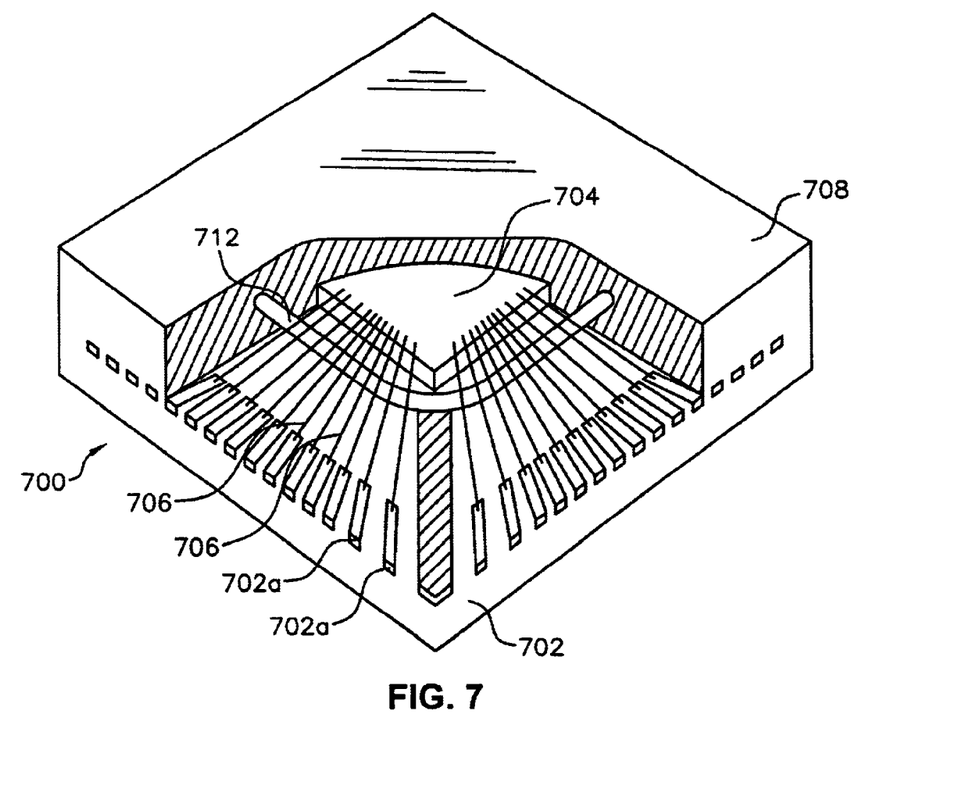
FIG. 7 is a perspective view of an interconnection between semiconductor elements in a semiconductor device in accordance with an exemplary embodiment of the present invention.

FIG. 7 illustrates a semiconductor device 700 including semiconductor element 704 mounted on leadframe 702. Bonding wires 706 provide interconnection between semiconductor element 704 and leadframe contacts 702a. Insulative material 712 is provided across a portion of bonding wires 706 to stabilize bonding wires 706 with respect to one another. In the exemplary embodiment of the present invention illustrated in FIG. 7, bonding wires 706 are provided in a substantially ring shape (and/or any suitable shape) around or about semiconductor element 704. By providing insulative material 712 across a portion of bonding wires 706, open or short circuiting of bonding wires 706 may be substantially reduced prior to and during application of overmold 708.

Figure 8:
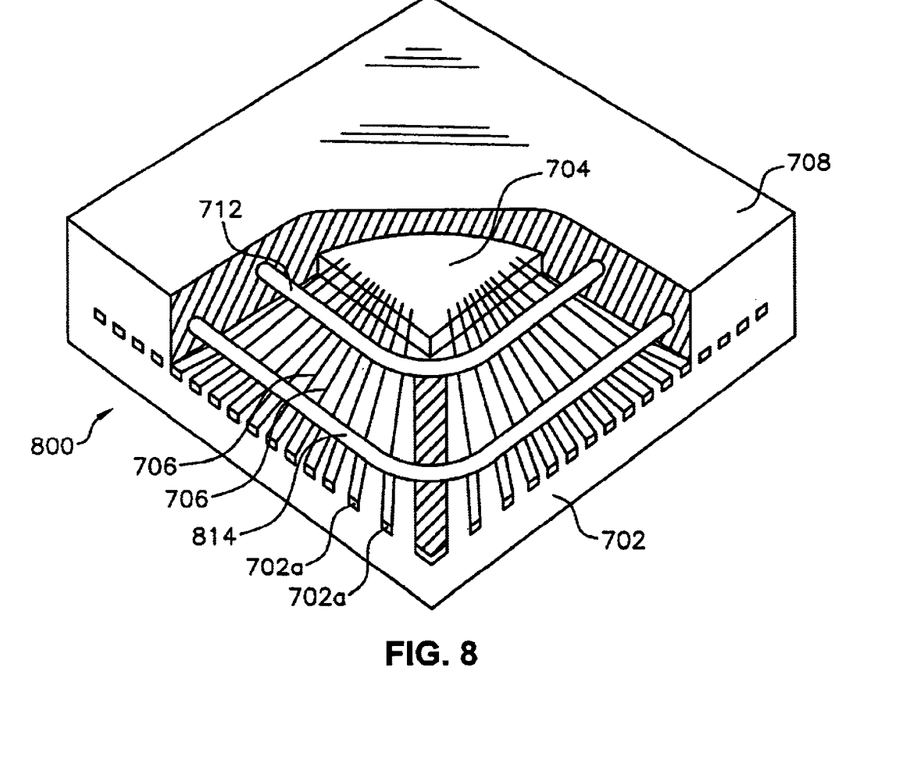
FIG. 8 is a perspective view of an interconnection between semiconductor elements in a semiconductor device in accordance with another exemplary embodiment of the present invention.

FIG. 8 is a perspective view of semiconductor device 800 similar to the device illustrated in FIG. 7. In addition to the ring shaped insulative material 712 provided in FIG. 7, FIG. 8 illustrates insulative material 814 provided across a portion of bonding wires 706. By providing insulative material 814 in addition to insulative material 712, bonding wires 706 are further stabilized with respect to one another.

Although FIG. 7 illustrates semiconductor device 700 including single insulative material ring 712, and FIG. 8 illustrates semiconductor device 800 including insulative material ring 712 and insulative material ring 814, additional rings (or other shaped portions) of an insulative material may be provided. As such, one, two, three, or any of a number of rings/beads of insulative material may be applied to a given semiconductor device, as desired.

Figure 9:
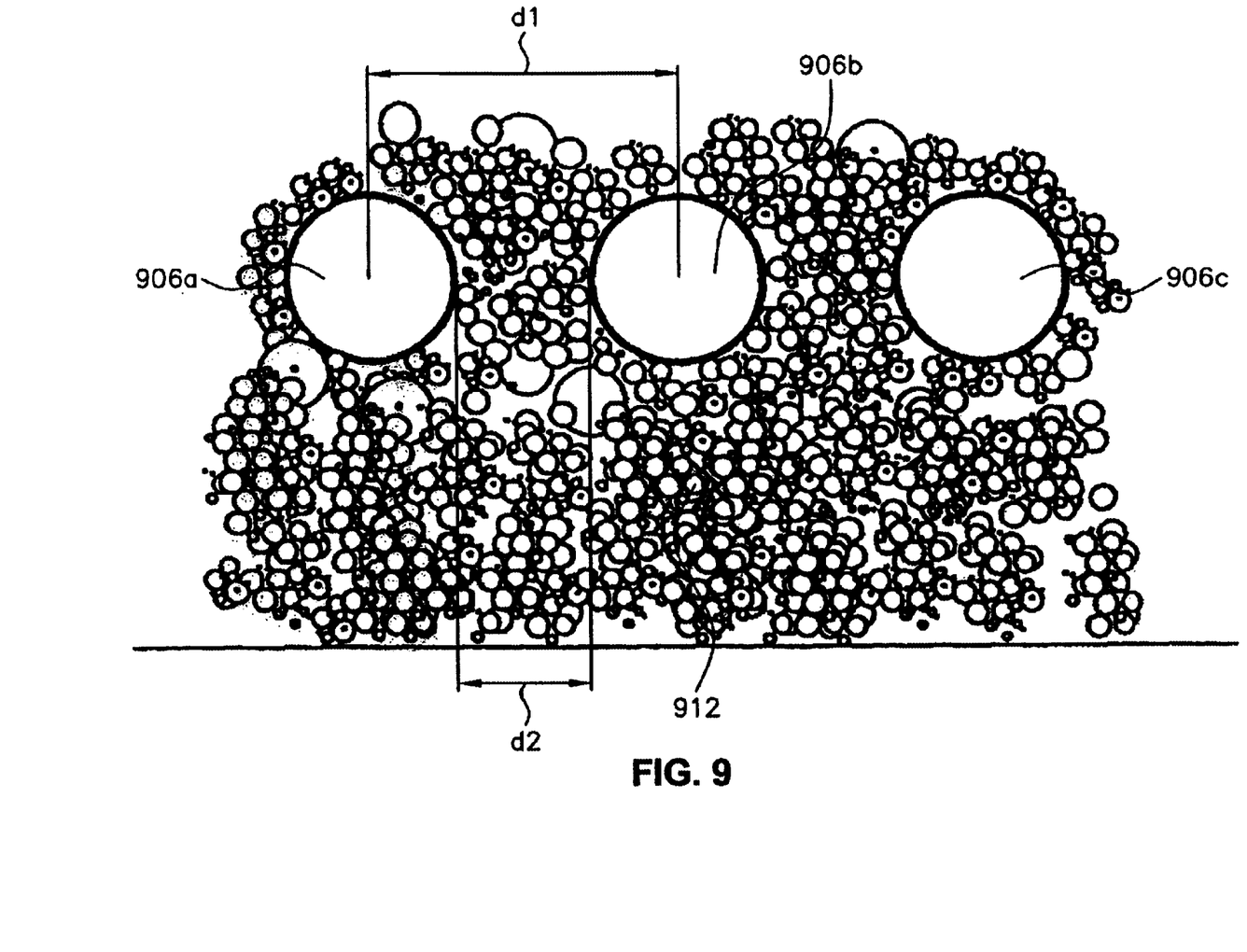
FIG. 9 is a cut away view of conductors separated by an insulative material in accordance with an exemplary embodiment of the present invention.

FIG. 9 is a cut away view of bonding wires 906a, 906b, and 906c. For example, bonding wires 906a, 906b, and 906c provide interconnection between a semiconductor element (not shown in FIG. 9) and leadframe contacts (not shown in FIG. 9) in a semiconductor device. Insulative material 912 is provided across a portion of bonding wires 906a, 906b, and 906c. In the exemplary embodiment of the present invention illustrated in FIG. 9, insulative material 912 includes insulative beads. The insulative beads may be of a variety of different sizes, and because the insulative beads are smaller than the distance between adjacent bonding wires (e.g., between bonding wire 906a and 906b), the insulative beads disperse into a position between adjacent bonding wires, thereby providing enhanced stability and insulation between adjacent bonding wires.

FIG. 9 illustrates a distance "d1" representing a center-to-center distance (i.e., pitch) between bonding wires 906a and 906b. Further, FIG. 9 illustrates a distance "d2" representing a spacing between bonding wires 906a and 906b. According to an exemplary embodiment of the present invention, the insulative material may be applied to ultrafine pitch bonding wired semiconductor devices. For example, distance d1 in such a device may be approximately 35 μm or less, and distance d2 in such a device may be approximately 15 μm or less. By providing insulative material (e.g., with insulative beads dispersed therein) across a portion of the bonding wires, the improved bonding wire stability of the present invention may be applied to ultrafine pitch bonding wired semiconductor devices with small values for distances d1 and d2.

By fabricating semiconductor devices according to the methods described herein, conductor density within a semiconductor device may be increased, desirably resulting in a semiconductor device of decreased size.

An additional benefit of fabricating semiconductor devices according to the present invention is that because of the inclusion of the insulative material across a portion of the bonding wires, the overmold/encapsulation material used to encapsulate the device may be constructed of a less expensive material and process (e.g., mold type encapsulation as opposed to "glob-topping") because the encapsulant does not necessarily need to stabilize the bonding wires.

The beads included in the insulative material utilized according to various exemplary embodiments of the present invention may be any of a number of types of insulative beads. For example, the beads may be constructed of a silica filler. Further, the insulative beads may be of varying types having varying sizes and shapes.

The insulative material of the present invention may include a high viscosity, ultraviolet curable silica. For example, the insulative material may be filled with silica at a weight percentage between 50–85%.

Figure 10:
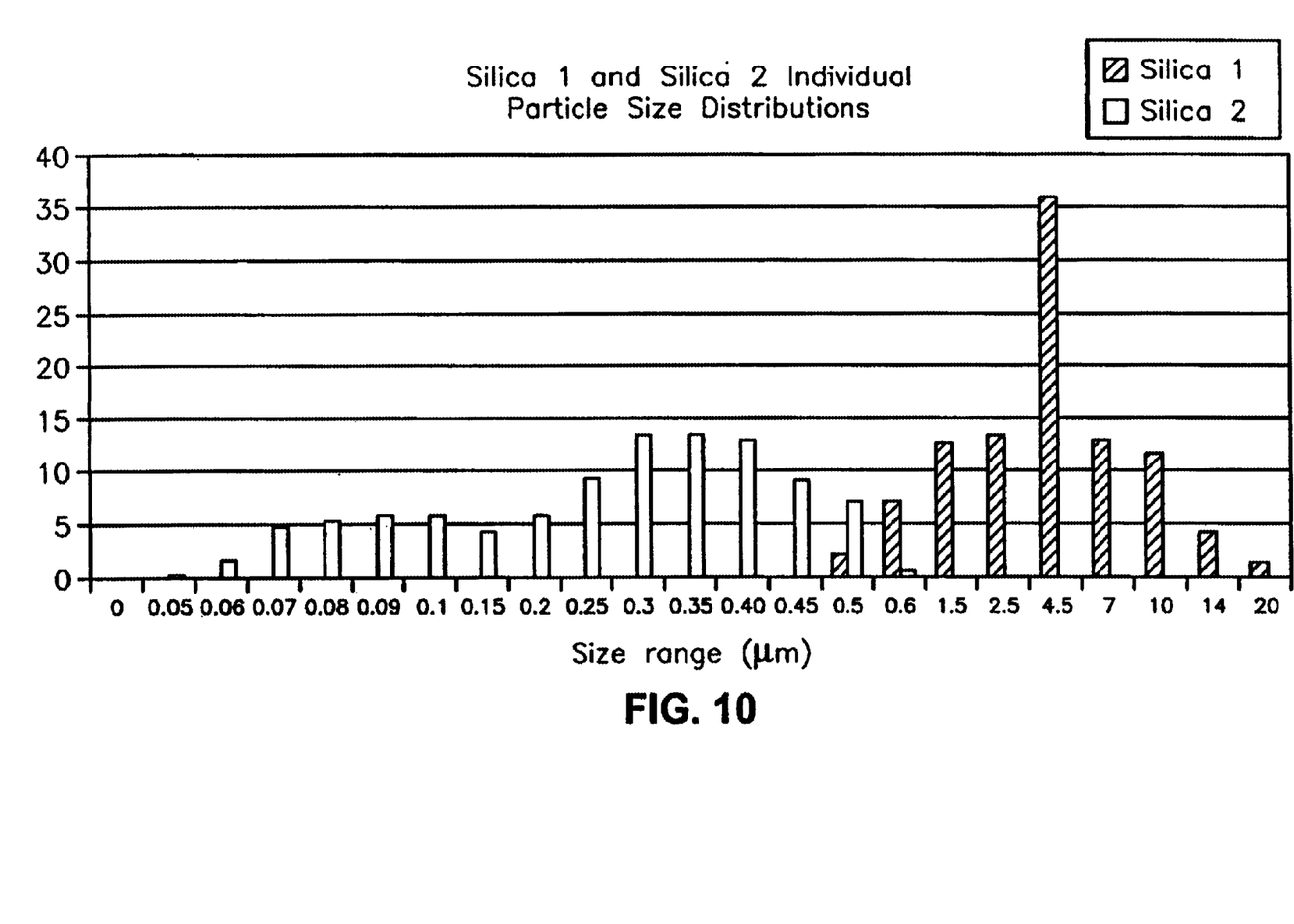
FIG. 10 is a chart illustrating a silica particle size distribution in an insulative material in accordance with an exemplary embodiment of the present invention.

FIG. 10 is a bar chart illustrating an exemplary particle size (i.e., particle size diameter) distribution of two distinct silica fillers (e.g., $SiO_2$) used in an insulative material according to an exemplary embodiment of the present invention. In the exemplary distribution illustrated in FIG. 10, the silica 2 particle size beads range from approximately 0.05 microns to approximately 0.5 microns. Further, the distribution of silica 1 particle size beads ranges from approximately 0.5 microns to approximately 20 microns. The y-axis of the bar chart of FIG. 10 illustrates the percentage of each size of each of the silica 1 and silica 2 particles.

The silica fillers charted in FIG. 10 have proven to be particularly useful when dispersed within insulative materials (e.g., epoxy resin) according to certain exemplary embodiments of the present invention. The individual distribution of the silica diameter sizes for the type of spherical silica designated silica 1 is: 0% are greater than 24 microns, 1.1% are less than 24 microns and greater than 16 microns, 4.0% are less than 16 microns and greater than 12 microns, 11.5% are less than 12 microns and greater than 8 microns, 12.8% are less than 8 microns and greater than 6 microns, 35.8% are less than 6 microns and greater than 3 microns, 13.3% are less than 3 microns and greater than 2 microns, 12.5% are less than 2 microns and greater than 1 microns, 7.0% are less than 1 microns and greater than 0.5 microns, and 2.0% are less than 0.5 microns and greater than 0 microns. The individual distribution of the silica diameter sizes for the type of spherical silica designated silica 2 is: 0% are greater than 0.6 microns, 0.5% are less than 0.6 microns and greater than 0.5 microns, 7.03% are less than 0.5 microns and greater than 0.45 microns, 9.13% are less than 0.45 microns and greater than 0.4 microns, 12.83% are less than 0.4 microns and greater than 0.35 microns, 13.43% are less than 0.35 microns and greater than 0.3 microns, 13.33% are less than 0.3 microns and greater than 0.25 microns, 9.33% are less than 0.25 microns and greater than 0.2 microns, 5.83% are less than 0.2 microns and greater than 0.15 microns, 4.33% are less than 0.15 microns and greater than 0.1 microns, 5.83% are less than 0.1 microns and greater than 0.09 microns, 5.93% are less than 0.09 microns and greater than 0.08 microns, 5.53% are less than 0.08 microns and greater than 0.07 microns, 4.93% are less than 0.07 microns and greater than 0.06 microns, 1.73% are less than 0.06 microns and greater than 0.05 microns, and 0.31% are less than 0.05 micron.

As provided above, insulative beads (e.g., silica particles) or varying types and sizes may be mixed in an insulative material according to certain exemplary embodiments of the present invention. For example, the silica 1 distribution of particles may be mixed with the silica 2 distribution of particles. In one embodiment, 10 parts of the silica 1 distribution of particles is mixed with 3 parts of the type silica 2 distribution of particles. A bar chart illustrating the $SiO_2$ particle size distribution of such a mixture if provided in FIG. 11.

Figure 11:
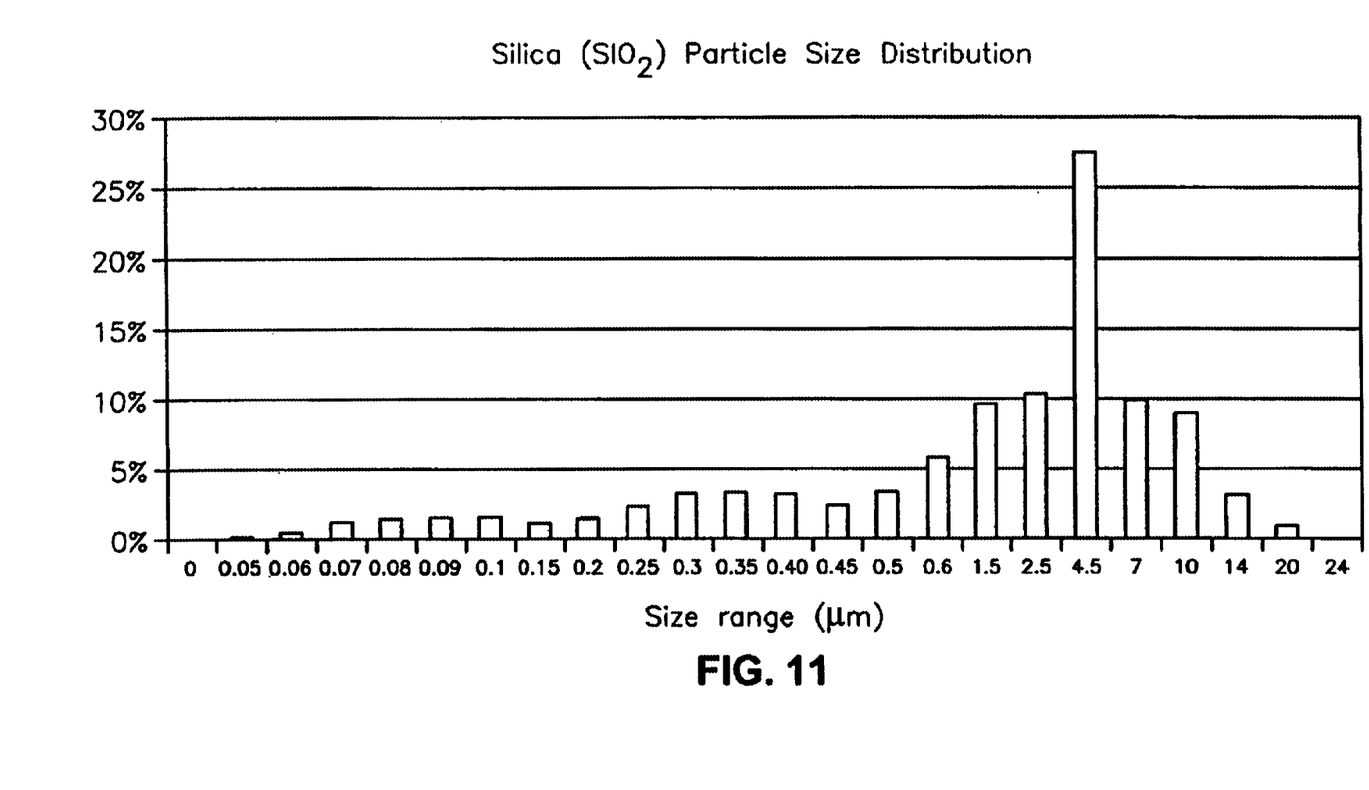
FIG. 11 is another chart illustrating a silica particle size distribution in an insulative material in accordance with an exemplary embodiment of the present invention.

The individual distribution of the silica diameter sizes for the mixture of spherical silica illustrated in FIG. 11 is: 0% are greater than 24 microns, 0.850% are less than 24 microns and greater than 16 microns, 3.08% are less than 16 microns and greater than 12 microns, 8.85% are less than 12 microns and greater than 8 microns, 9.85% are less than 8 microns and greater than 6 microns, 27.54% are less than 6 microns and greater than 3 microns, 10.23% are less than 3 microns and greater than 2 microns, 9.62% are less than 2 microns and greater than 1 microns, 5.5% are less than 1 microns and greater than 0.6 microns, 3.16% are less than 0.6 microns and greater than 0.5 microns, 2.11% are less than 0.5 microns and greater than 0.45 microns 2.96% are less than 0.45 microns, and greater than 0.4 microns, 3.1% are less than 0.4 microns and greater than 0.35 microns, 3.08% are less than 0.35 microns and greater than 0.3 microns, 2.15% are less than 0.3 microns and greater than 0.25 microns, 1.35% are less than 0.25 microns and greater than 0.2 microns, 1.0% are less than 0.2 microns and greater than 0.15 microns, 1.35% are less than 0.15 microns and greater than 0.1 microns, 1.37% are less than 0.1 microns and greater than 0.09 microns, 1.28% are less than 0.09 microns and greater than 0.08 microns, 1.14% are less than 0.08 microns and greater than 0.07 microns, 0.4% are less than 0.07 microns and greater than 0.06 microns, 0.07% are less than 0.06 microns and greater than 0.05 microns, and 0% are less than 0.05 microns.

Figure 12:
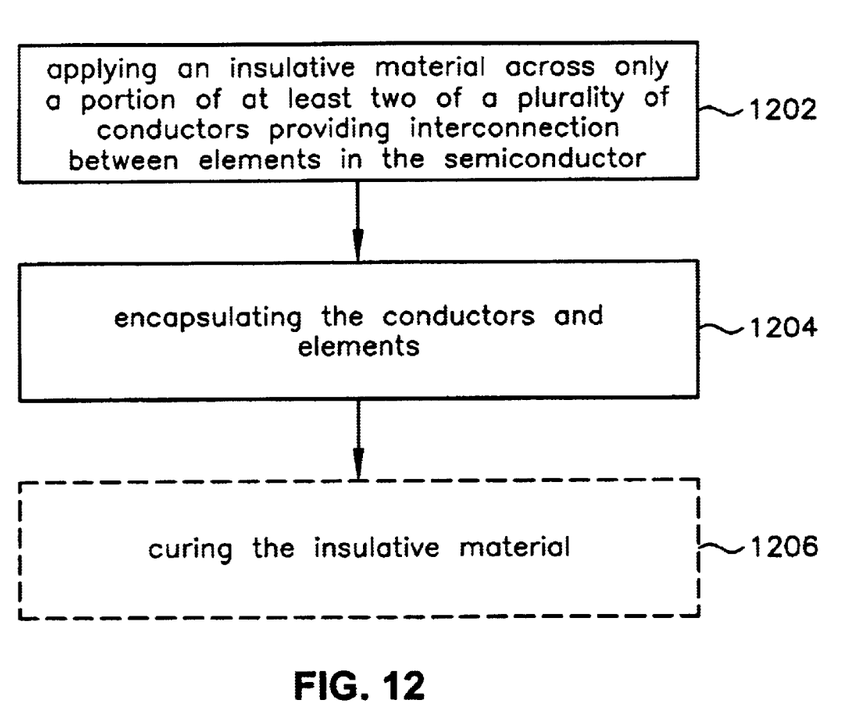
FIG. 12 is a flow diagram illustrating a method of packaging a semiconductor device in accordance with an exemplary embodiment of the present invention.

FIG. 12 is a flow diagram illustrating a method of packaging a semiconductor device. At step 1202, an insulative material is applied across only a portion of at least two of a plurality of conductors providing interconnection between elements in the semiconductor device. At step 1204, the conductors and semiconductor elements are encapsulated, thereby packaging the semiconductor device. At optional step 1206, the insulative material is cured after the applying step.

Although the present invention has been described primarily in relation to a ring or rectangular shaped insulative material around or about a semiconductor element included in the semiconductor device, it is not limited thereto. The insulative material may be provided in a number or configurations (e.g., a linear bridge of insulating material), so long as the conductors are stabilized to reduce wire sweep.

Further, the insulative compound may be applied in a substantially circumferential shape about an inner element of the semiconductor device. The substantially circumferential shape may be any of a number of geometric shapes such as a ring, a circle, an oval, a square or a rectangle. Further still, because the geometric shape is substantially circumferential, it does not necessarily completely surround the inner element of the semiconductor device.

Although the present invention has been described primarily in relation to an insulative material being a polymer material such as an epoxy resin, it is not limited thereto. Various alternative insulative materials may be utilized so long as the material provides stability to conductors providing interconnection between elements of the semiconductor device. For example, a solid or substantially solid insulator having an adhesive backing may be applied to a portion of the bonding wires, thereby stabilizing the bonding wires and substantially reducing the potential for short circuiting among adjacent bonding wires. Alternatively, an insulative tape may be applied to a portion of the bonding wires, also stabilizing the bonding wires and substantially reducing the potential for short circuiting among adjacent bonding wires.

In embodiments of the present invention including insulative particles in the insulative material, the particles have been described primarily in relation to silica particles; however, the particles are not limited thereto. Various alternative particles or beads may be utilized in the insulative material so long as the particles may disperse between adjacent conductors providing interconnection between elements of the semiconductor device.

It will be appreciated that other modifications can be made to the illustrated embodiments without departing from the scope of this invention, which is separately defined in the appended claims.

What is claimed:

1. A method of packaging a semiconductor device, the method comprising the steps of:
    applying an insulative material including insulative beads across only a portion of at least two of a plurality of conductors providing interconnection between elements in the semiconductor device; and
    encapsulating the conductors and elements, thereby packaging the semiconductor device.

2. The method of claim 1 further comprising the step of:
    curing the insulative material after said applying step.

3. The method of claim 2 wherein said curing step includes at least one of heating the insulative material and exposing the insulative material to UV radiation.

4. The method of claim 1 wherein the insulative beads included in the insulative material in said applying step comprise spherical silica particles.

5. The method of claim 4 wherein the insulative material is applied in a substantially circumferential manner about an inner element of the semiconductor device.

6. The method of claim 4 wherein the insulative material is applied in at least two geometric shape structures, each of the geometric shape structures substantially surrounding an inner element of the semiconductor device in a circumferential manner.

7. A method of packaging a semiconductor device, the method comprising the steps of:
    applying a solid insulator having an adhesive backing across only a portion of a plurality of conductors such that the adhesive backing is in contact with the portion of a plurality of conductors and not in contact with elements of the semiconductor device electrically connected by the plurality of conductors; and
    encapsulating the conductors and elements, thereby packaging the semiconductor device.

8. The method of claim 7 wherein said applying step includes applying an insulative tape to the portion of a plurality of conductors.

9. The method of claim 1 wherein said applying step includes applying a continuous bead of the insulative material across only a portion of at least two of a plurality of conductors providing interconnection between elements in the semiconductor device.

10. The method of claim 1 wherein said applying step includes applying the insulative material around a peripheral portion of an inner element of the semiconductor device.

11. The method of claim 1 wherein said applying step includes applying the insulative material in at least two distinct structures around a peripheral portion of an inner element of the semiconductor device, the two structures not being in contact with one another.

* * * * *